(12) United States Patent
Gieser

(10) Patent No.: US 6,512,362 B1
(45) Date of Patent: Jan. 28, 2003

(54) METHOD AND DEVICE FOR CHARGING INTEGRATED CIRCUITS AND STRUCTURES WITH A PULSED HEAVY CURRENT

(75) Inventor: Horst Gieser, Munich (DE)

(73) Assignee: Fraunhofer Gesellschaft zur Foerderung der angewandten Forschung e.V. (DE)

( * ) Notice: Subject to any disclaimer, the term of this patent is extended or adjusted under 35 U.S.C. 154(b) by 0 days.

(21) Appl. No.: 09/508,419

(22) PCT Filed: Aug. 11, 1998

(86) PCT No.: PCT/DE98/02391

§ 371 (c)(1),
(2), (4) Date: Mar. 13, 2000

(87) PCT Pub. No.: WO99/13349

PCT Pub. Date: Mar. 18, 1999

(30) Foreign Application Priority Data

Sep. 11, 1997 (DE) .......................................... 197 39 923

(51) Int. Cl.[7] .............................................. G01R 31/02
(52) U.S. Cl. .................... 324/158.1; 324/754; 324/758
(58) Field of Search ............................ 324/158.1, 252, 324/456, 678, 719, 755, 754, 761, 762, 72.5, 756, 758, 765; 439/8, 9, 6; 702/95, 82, 117; 73/849, 853

(56) References Cited

U.S. PATENT DOCUMENTS

| 5,023,684 A | * | 6/1991 | Tsunoda |
| 5,132,612 A | * | 7/1992 | Burns |
| 5,410,254 A | * | 4/1995 | Consiglio |
| 5,506,515 A |   | 4/1996 | Godshalk et al. |
| 5,519,327 A |   | 5/1996 | Consiglio |
| 5,539,306 A |   | 7/1996 | Riggio, Jr. |
| 5,594,358 A |   | 1/1997 | Ishikawa et al. |
| 5,642,056 A | * | 6/1997 | Nakajima |
| 5,786,689 A | * | 7/1998 | Kimura |
| 5,804,977 A | * | 9/1998 | Consiglio |

FOREIGN PATENT DOCUMENTS

EP          0 743 676          11/1996

OTHER PUBLICATIONS

Gieser et al., "Very–fast transmission line pulsing of integrated structures and the charged device model", Electrical Overstress/Electrostatic Discharge Symposium Proceedings, 1996, (IEEE CAT. No. 96TH8150), Proceedings of 18TH Annual Electrical Overstress/Electrostatic Discharge Symposium, Orlando, FL, USA, Sep. 10–12, 1996, Seiten 85–94, XP002089929 1996, Rome, NY, USA, ESD Assoc., USA.

* cited by examiner

Primary Examiner—Michael Sherry
Assistant Examiner—Trung Nguyen
(74) Attorney, Agent, or Firm—Venable; Robert Kinberg; Jeffri A. Kaminski

(57) ABSTRACT

For a quantification of the electrostatic responsiveness and for the extraction of high-current parameters of integrated circuits and individual structures (DUT—"Device under Test") a method and a device are proposed wherein a high current pulse can be injected via a terminal into the DUT under strictly defined marginal conditions. The substrate into which the circuit to be analysed is integrated, together with the reference electrode disposed at a defined spacing, forms a capacitor dependent on the actual circuit and determining the loading parameters, which capacitor has a dielectric consisting, as a rule, of air. The method is characterised by an intrinsic impedance which is almost constant throughout the entire system and defined by the mechanical and material properties. It is also possible to use a complete semiconductor wafer including a plurality of circuits as substrate.

22 Claims, 5 Drawing Sheets

METHOD AND DEVICE FOR CHARGING INTEGRATED CIRCUITS AND STRUCTURES WITH A PULSED HEAVY CURRENT

FIELD OF THE INVENTION

The present invention relates to a method of and a device for pulsed high-current loading of integrated circuits and structures.

BACKGROUND OF THE INVENTION

One of the main causes of failure of integrated circuits are electrostatic discharges (ESD) during which the discharge current flows through the integrated circuit. Together with electric overstress (EOS), which is difficult to distinguished therefrom, they account for approximately 50% of the cases of field failure. External capacitors such as the human body or even the component as such (charged device) including the integrated circuit inside come into question as ESD charge sources. Charging is produced by friction (tribologic electricity) or by induction and contact in the electro-static field.

For protection of the integrated circuits protective structures are used on their inputs and outputs. These protective structures are intended, on the one hand, to take no influence on the functional integrity of the circuit, but, on the other hand, in the case of discharge they should branch off high currents along reliable paths around the core of the circuitry or out thereof, limiting the voltages to values which are not critical for the interior (e.g. gate oxides) of the circuit. For the synthesis of such a protective concept it is of vital importance to know the characteristics of these structures precisely within the pertinent current and time ranges.

Moreover, for the industrial product qualification the efficiency of such a protective concept must be verified and quantified in view of the electrostatic loads occurring in real operation. The qualification must be performed separately by housing types. To this end, characteristic load models such as the Human Body Model (HBM) and the Charged Device Model (CDM) with their derivatives have been defined. These models are substantially distinguished from each other by their current and time ranges. On account of the definition of a 1.5 k serial resistor and a 100 pF capacitor the Human Body Model presents a double exponential current development increasing within the range from up to 10 ns to approximately 0.66 A/kV precharging voltage and flowing via two terminals of the integrated circuit, By contrast, the capacitance of CDM discharge is defined only by the component as such or by its conductive elements relative to its environment. As the chip and housing area increases, this capacitance also increases due to the increasing number of pins (>300) and the reduction of the thickness of the housing. The risk of ESD commences when the terminals are separated after the chip has been pressed in the plastic housing, and still persists even after its assembly in a printed circuit board. As a result of ever-increasing automation, the probability of a load according to the Charged Device Model increases as well. The CDM model excels itself not only by the exchange of charges via an individual terminal of the circuit, but also by its very high currents of up to several Ampere, which are limited only by the terminal inductance and the sparking resistance and which are reached within fractions of a nano second.

Due to the high current, high voltage drops by several 10V may be established across the protective structures and supply lines, which become an imminent danger for the even thinner gate oxides, even when the protective structure responds at the sufficient rate. As the distance of the breakdown voltage from the gate oxides and pn junctions for protection and for more complex supply bus systems increases, the imminent risk continues rising which is involved by the extremely short high-intensity pulses of the CDM.

The quantification of the electrostatic load-bearing capacity is therefore realized in ESD testers in which the different loading models are implemented. Protective elements and integrated structures in the high-current range can be characterized by means of rectangular pulses which are, as a rule, generated by the discharge of lines and which are applied to the two terminals of a protective element.

The ESD load-bearing capability of integrated circuits in correspondence with the CDM model has so far been quantified in testers which are distinguished from each other by the type of the discharge contact, by the type of the device mounts, and by the charging principle. The standardization of the testing method has been and is strongly impeded by substantial correlation problems. One cause is the complex interactions among the integrated circuit, its housing, the test adapter and the testing device as such, which occur during the very short pulses. These interactions take an influence first on the discharge current and second on the effects which this current produces on the circuit. A key problem is the pulse measuring technique which is insufficient for the individual current increases (<100 ps) of so steep a slope.

Among the known CDM testers a distinction is made among the following types:

(1) Non-Contact, Non-Socketed (NN)

The charged component is placed in a rear position on a grounded conductive support. For loading, a grounded low-inductance electrode is attached to the component terminal to be loaded. The discharge then takes place in dependence on the field intensity and the ignition conditions by sparks or metal contact. This technique, however, displays a bad reproducibility of the current development in the case of pre-charging voltages higher than 1 kV. Moreover, with vertically arranged (DIL), the contact is not reliable for very small or even bent terminals. Further uncertainties arise as a result of mechanical-electrical spring contacts. The mechanical positioning permits only a very slow test sequence. The insufficient bandwidth of the available pulse measuring technique creates additional problems. The sensitive HF cables and connectors, which are required for discharge current measurement, may prematurely age and falsify the test result in view of frequent re-positioning during the test.

(2) Contact, Non-Socketed (CN)

The charged component is placed in a rear position on a grounded conductive support. An opened relays connects the charged device to the ground of the tester. A relay is closed for loading.

In this method, however, only a decelerated low-amplitude discharge occurs as a consequence of the relay and its inductance. The method displays a bad reproducibility of the current development in the case of pre-charging voltages higher than 1 kV by spark discharge. Moreover, the contact is unreliable in the case of very small or even bent terminals. The mechanical positioning permits only a slow test sequence. The measuring technique of this method can be mapped on the technique of the "nn" type only conditionally.

(3) Non-Contact, Socketed (NS)

The component is arranged on a test mount, possibly a test adapter, or a printed circuit board to increase the spacings between the terminals. The test amount in its entirety, inclusive of all lines provided thereon, is charged relative to the testing system. For loading, one terminal is contacted by attaching two contacts under atmospheric conditions. The mount and board capacitance (background capacitance) present behind the component is discharged via this terminal. In this method a complex system of lines and line termination resistors determine the complex discharge current shape and, in combination with the integrated circuit, may result in unforeseeable effects. As significant pulse measuring methods are lacking, the result can only be transferred to other systems or to another type with difficulties or not all. Another disadvantage resides in the aspect that background capacitance taking an influence on the fail voltage and the physical failure signature increases the accumulated energy.

(4) Contact, Socketed (CS)

The component is disposed in a test mount, possibly a test adapter, or a printed circuit board to increase the spacings between the terminals. The test mount in its entirety, inclusive of all lines provided thereon, is charged relative to the testing system. For loading, one terminal is contacted via one or several relays, and the mount and board capacitance (background capacitance) present behind the component is discharged via this terminal. The disadvantages of this method correspond to those presented by the aforedescribed "ns" type.

In testing systems without a mount, a field-induced charging is also possible. In this operation the potential of the electrode under the device is raised for charging, and a first transient contact with the ground electrode is established. The potential of the electrode is then lowered again and the contact with the ground electrode is established a second time. During this cycle the device is normally loaded twice with alternating polarity.

Another known method relates to the "Small Capacitor Model" (SCM) which is currently used in Japan and where a charged 10 pF capacitor is contacted with the device terminal to be loaded. The reproducibility and transferability are strongly dependent on the actual structure in this case, too.

All the testing systems so far presented serve to load housed integrated circuits and modules exclusively. If they were employed directly for tests on the wafer level, the tip ought to be positioned with a precision of ±20 µm. In real structures, the capacitance would be established substantially between the silicon substrate and the substrate support isolated therefrom, and the mobile charge would be located on the substrate underside of the integrated circuit. This, however is in opposition to the distribution of charges in housed devices which are located in correspondence with the unsocketed CDM techniques. Here the mobile charge is located on the metal coating on the chip surface and the metal parts of the housing.

The advantages and disadvantages of the test systems so far presented are complementary particularly in view of reproducibility and transferability of the load. A substantial improvement on the basis of the existing systems is not conceivable because in the predominantly pragmatic approaches oriented by the reproduction of field failure a physically unambiguous definition is missing which can be transferred from one system to the other.

A very fast rectangular-pulse generator, which is applied for characterizing integrated structures, is exhaustively discussed in the publication by H. Gieser, M. Haunschild: "Very-Fast Transmission Line Pulsing of Integrated Structures and the Charges Device Model", Proc. of the EOS/ESD Symposium, Phoenix, U.S.A., 1966, pages 85 et seq. In that device a rectangular-pulse generator is involved which operates on the transmission line principle and which generates pulses having a length between 3.5 ns and 11.5 ns, and which couples into an integrated structure via two terminals in correspondence with the time range reflectometric method (TDR) which is common in high-frequency technology.

As a result of a numerical superimposition of the flowing and returning voltage pulse the voltage and current load is determined on the analysed integrated structure.

The present invention is now based on the problem of providing a method of and a device for pulsed high-current loading, which permit the loading of complete integrated circuits with and without a housing, even at the wafer level, with ultra-short high-current pulses in a comparable and reproducible manner as well as the quantification of their load-bearing capacity in view of CDM-typical failure mechanisms.

SUMMARY OF THE INVENTION

The monitoring of the electrical failure criteria before and after loading should be possible without major structural modifications. Furthermore, this method is intended to increase the efficiency and the physically substantiated significance of the complete qualification process. It should moreover be possible to employ components and systems according to prior art, which are efficient in terms of costs and which are largelystandardized, instead of individual detail solutions, which are difficult to calibrate.

For the quantification of the electrostatic responsiveness and for the extraction of high-current parameters of integrated circuits and individual structures (DUT—Device under Test) a method and a device are proposed wherein a high current pulse can be injected via a terminal into the DUT under precisely defined marginal conditions. The substrate into which the circuit to be analysed is integrated, together with the reference electrode located at a defined distance, forms a capacitor which is dependent on the actual circuitry and determines the load parameters, with the dielectric of this capacitor being air as a rule.

The method of characterized by a intrinsic impedence (characteristic impedence) which is almost constant throughout the entire system and which is defined by the mechanical and the material properties. A complete semiconductor substrate wafer with a plurality of circuits may also be used as substrate.

Elements which generate pulses at a low stray dispersion (relays, solid-state switches) of a sufficient electric strength (e.g. 1 kV) and short response time (e.g. 300 ps) are expediently employed. Provisions may also be made for in situ measurement of the pulses approaching the device and reflected thereby. Furthermore, with a simple replacement of the capacitively coupled current injector by an injector having two terminals, or with the arrangement of a further contact electrode in a mount on the reference electrode, it is also possible to realize a current-voltage characterization of integrated structures up to the high-current range. With this technique and this device, failure mechanisms and pulse ranges of the electrostatic charging model "Charged Device Model (CDM)" are addressed where the load is determined in reality almost exclusively by the component as such or by the charge exchanged between the component and the environment within a few nano seconds.

The inventive device and the inventive method will be explained in more details by exemplary embodiments in the following, with reference to the drawing wherein:

BRIEF DESCRIPTION OF THE DRAWINGS

FIG. 1 shows an exemplary embodiment of an inventive device for pulse injection into a terminal of an integrated circuit, which is to be loaded. It is composed of a reference electrode 3 which is adjusted above a substrate 8 at a defined spacing 1. The substrate mount consists of a supporting plate 10 and an isolator 9 located thereon. The substrate mount is adapted for being adjusted along the x-, y- and z-directions and for being rotated through 360°. Moreover, the device comprises a needle-shaped contact electrode 7 and the carrier 4 supporting the reference and contact electrodes. A spacer 2 may be provided between the reference electrode 3 and the substrate 8.

Figure 1:
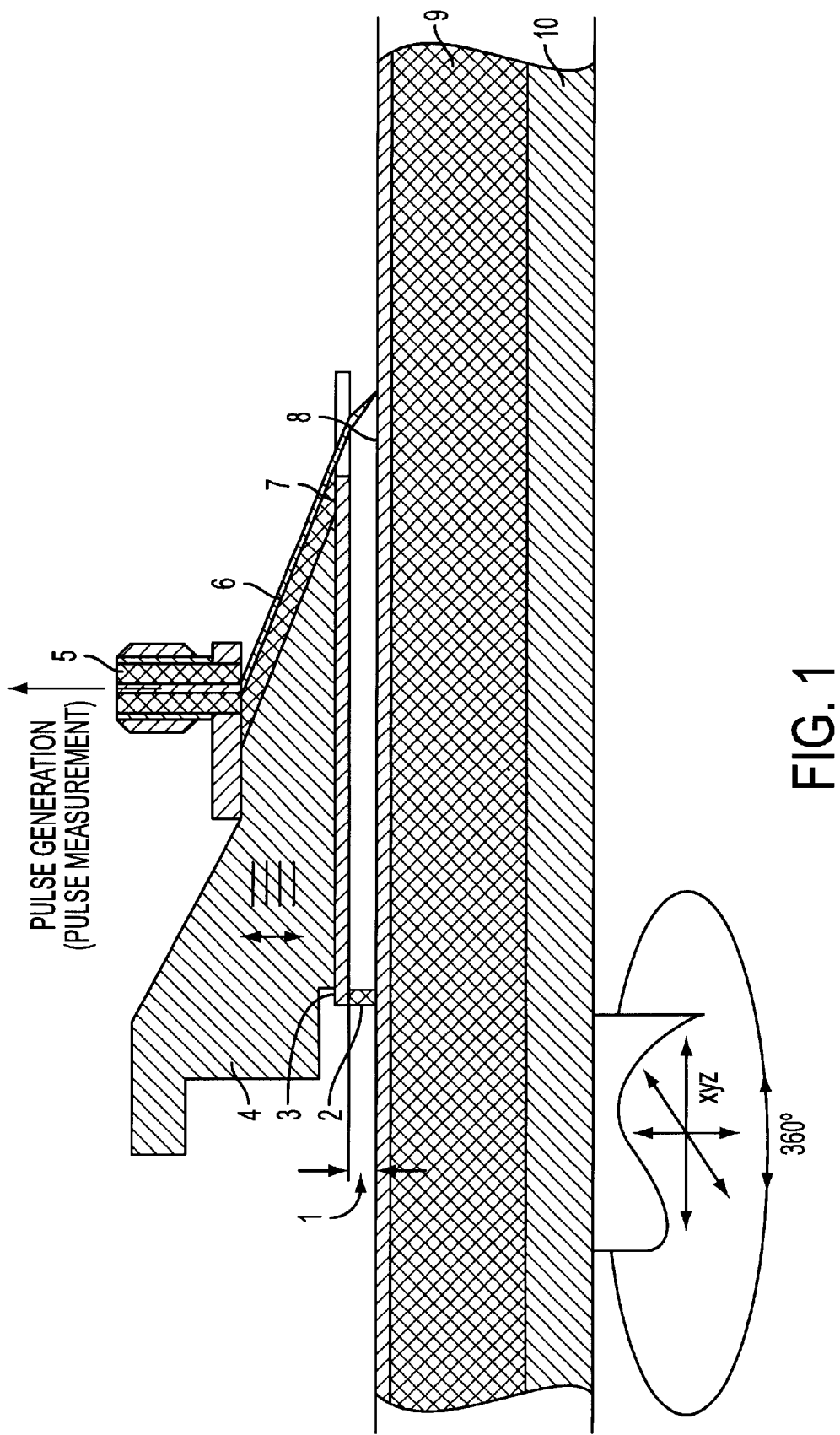
FIG. 1 is a cross-sectional view of an exemplary embodiment of the inventive device.

The capacitance of the integrated circuit 8 is defined by the total of the partial capacitances between the integrated circuit and the reference electrode 3 and between the integrated circuit and the substrate support 10 considered as electrode. The thickness and the dielectric constant of the dielectric 9 must be so dimensioned that the lower capacitance fraction remains at a negligibly low lever. The area of the reference electrode should project beyond the dimensions of the maximal integrated circuits to be analysed on three sides by at least several heights 1. In correspondence with prior art, the height 1 may be set by means of a vertically calibrated manipulator driven by a stepping motor or by means of calibrated micrometer screws with insulating separators. The distance of the reference electrode from the substrate surface may amount to 0.5 mm for instance. The metal plate of a wafer prober with a poly-ethylene dielectric having a thickness of 5 mm, which is placed thereon, may be used as substrate mount. Depending on the size of the circuits to be analysed the area of the reference electrode will be within the range between 100 and 1000 mm².

The possibility of qualifications as a function of the capacitance of the integrated circuit results from the possibility of setting the distance. A constant height 1 may also be defined by thin bolts or a thin bar made of an isolating, dimensionally stable isolator material resting on the substrate 8 outside the dimensions of the integrated circuit, or on the isolator 9, with correction by the thickness of the substrate. The reference electrode 3 is fastened on the injector support 4 which, in its turn, may be fastened on a commercial manipulator of an automatic wafer testing device. A mechanical precision and resistance to vibrations of the structure, which is sufficient for the respective application, is required for reliable constancy of and contact establishment with the integrated circuit.

It is also possible to use a vacuum mount as holder. The holes of this vacuum holder do not take an influence on the capacitance fractions between the reference electrode and the integrated circuit because the capacitance fraction contributed by the mount remains at a negligibly low level, as has been set out above.

The contact with the integrated circuit, with matching in terms of intrinsic impedence, is established by means of the conductor 7 which is configured as needle, truncated cone or semi-sphere and which co-operates with a dielectric 6 and the injector support 4 for forming a line corresponding to the intrinsic impedance of the entire system. A standardized HF terminal element 5 is provided on the other end of the contacting line, connecting the pulse injector to the high-current pulse line. When a pulse generator device, operating on the transmission line principle and using 50Ω pulse lines, is employed, the complete system formed by the pulse generator, the pulse line and the injector, may be matched with an intrinsic impedance of 50Ω. Hence, stringently defined conditions prevail up to the terminal of the integrated circuit so that the influence on the pulse shape remains at a minimum.

The contacts must be established through a cut-out in the reference electrode so that adjustment can be made relative to the respective connecting area (pad) of the integrated circuit by means of a microscope or an automatic pattern recognition system.

In the method, for example, the integrated circuit to be loaded is initially selected on the substrate. Then a rough adjustment of the reference electrode is performed above the integrated circuit by means of rotation and displacement along the x-, y- and z-axes. Finally, the fine adjustment of the spacing of the reference electrode and the fine adjustment of the contact electrode are performed via the connecting pad. After the contact has been established the circuit is loaded with the current pulse.

Figure 2:
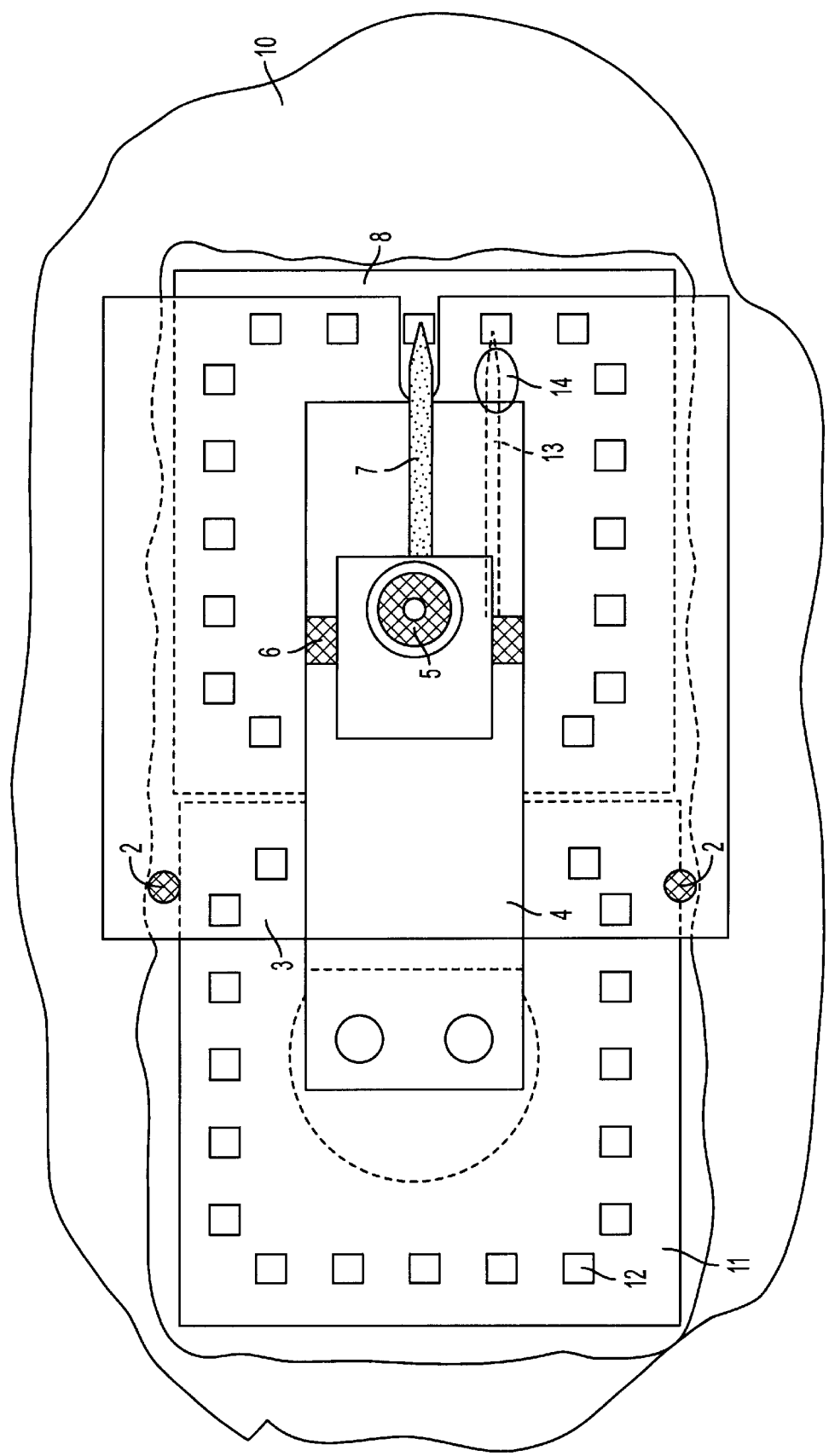
FIG. 2 is a plan view of the device according to FIG. 1.

The plan view in FIG. 2 shows furthermore the connecting areas 12 of two integrated circuits 11. Moreover, this Figure illustrates the almost complete overlapping of the circuit to be loaded and the reference electrode 3. The influence produced by marginal capacitance effects is reduced by causing the area of the reference electrode 3 to project beyond the area of the integrated circuit 11 on three sides by a multiple of the distance therebetween.

Furthermore, the position is indicated in dashed lines where a further contact electrode 13 may be used for contacting a total of two connecting pads. In this way it is possible, for instance, to establish a ground contact for high-current characterisation (cf. FIG. 5). This additional contact electrode is passed through an opening 14 of the reference electrode.

In particular, FIG. 2 shows two adjacent circuit integrated into one waver hidden beneath the reference electrode 3. The interconductor of the contact electrode 7 is in contact with one pat of the integrated circuit. The contract electrode 7 projects through a recess or opening in the reference electrode 3. This recess or opening can be seen in the region of the tip of the contact electrode 7 and FIG. 2. The same recess or opening in the reference electrode can be seen in FIGS. 1, 3 and 4.

Figure 3:
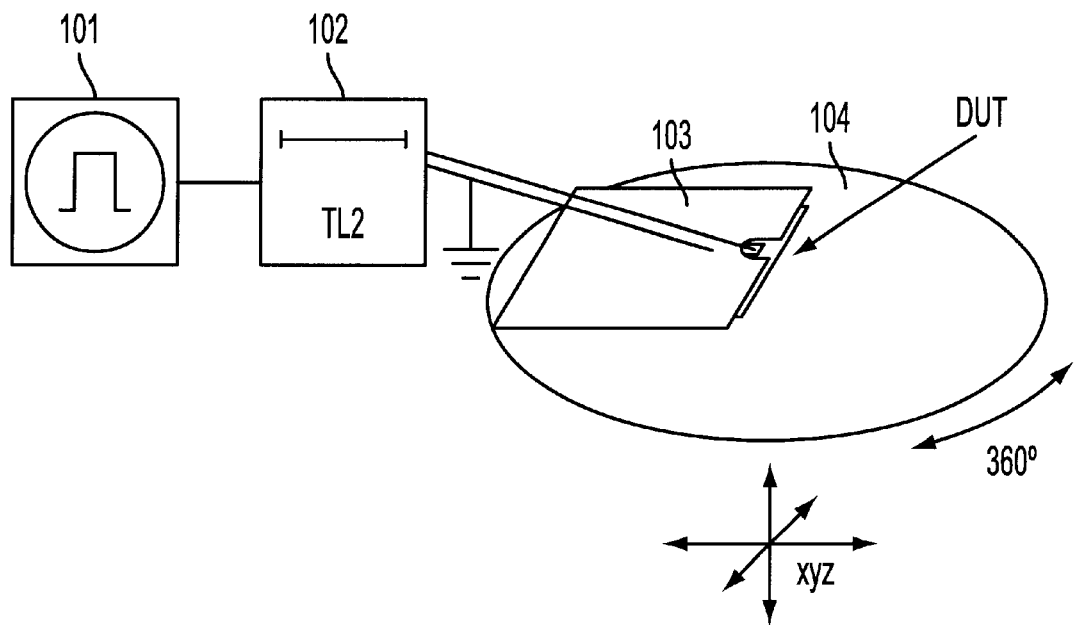
FIG. 3 illustrates an exemplary embodiment of the application of the inventive device.

FIG. 3 shows an example of the application of the inventive device. The system illustrated there for pulse loading an integrated circuit (DUT) consists of a rectangular-pulse generator 101, the transmission line 102, the capacitively coupled current injector 103, and the substrate mount 104. The DUT is fixedly placed on the substrate and component mount 104 which, in this case, has three axes for translation and one rotational axis (not drawn to scale).

The pulse can be generated in correspondence with prior art either in a reproducible manner by means of a coaxial relay or a solid-state switch. To this end a charged coaxial line having a defined intrinsic impedance is discharged. For attenuation of multiple reflections a coaxial attenuator 204 is integrated into the pulse line, which has a sufficient electric strength. When a generator is employed the line is terminated on the source side.

Figure 4:
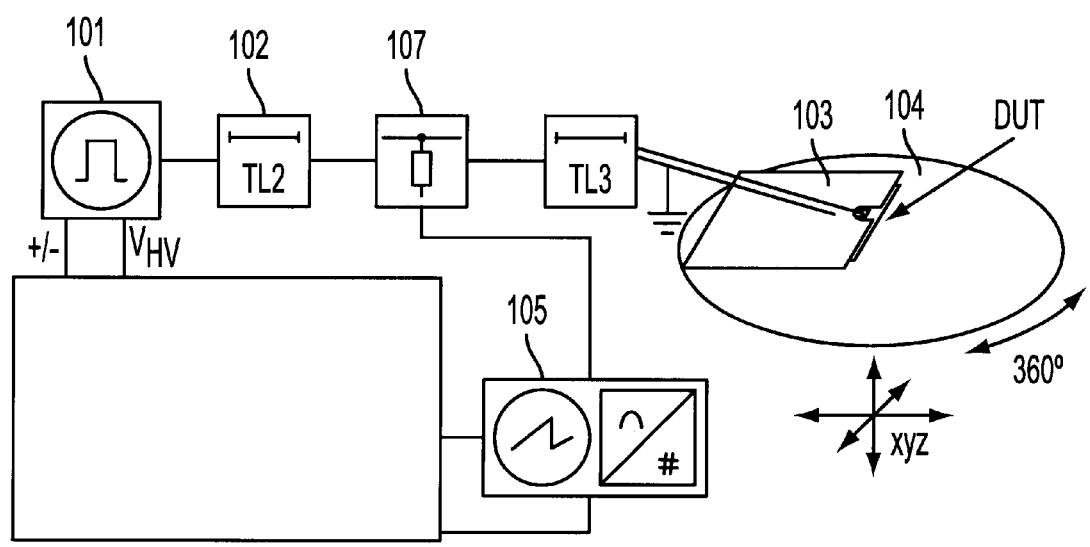
FIG. 4 shows a second exemplary embodiment of the application of the inventive device.

FIG. 4 illustrates an extended example of the application of the inventive device. The system illustrated here additionally includes a pulse measuring unit 105 for monitoring the load and a control computer 106. The control computer has the functions of a system controller, a data processor and a data-storing memory.

Figure 5:
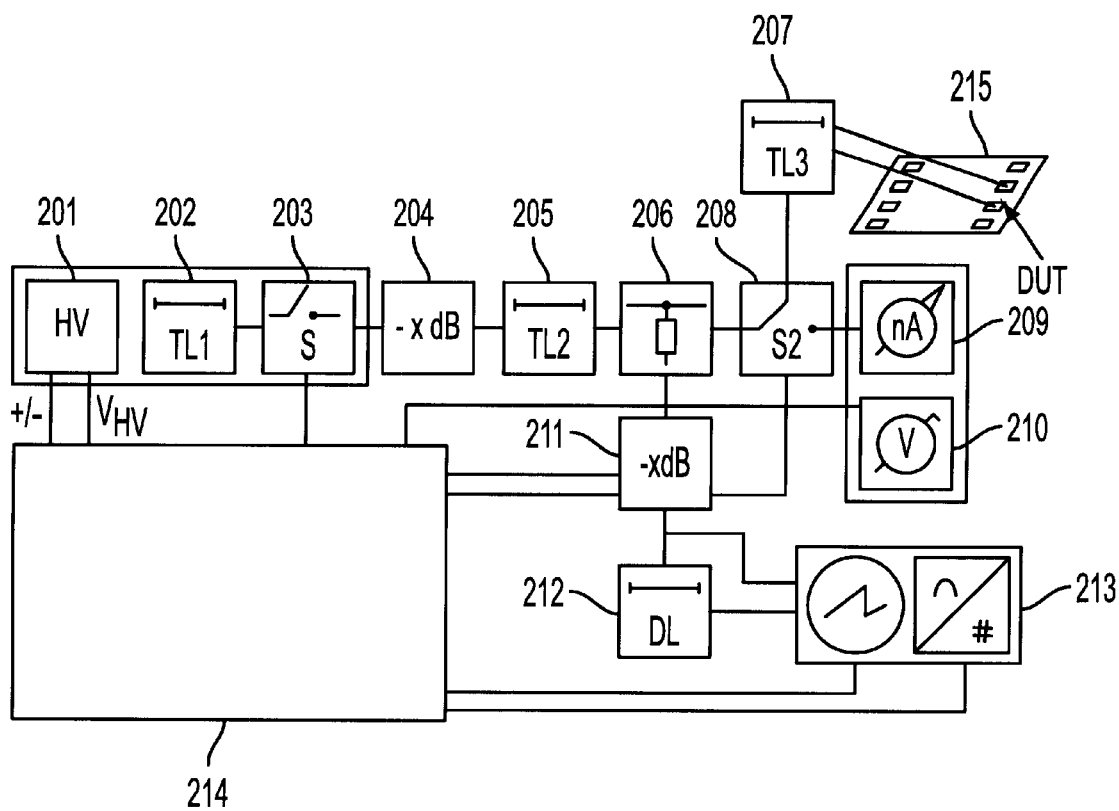
FIG. 5 is a view of a third exemplary embodiment of the application of the inventive device.

FIG. 5 illustrates an example of implementation for the high-current characterization of elements having two terminals. It comprises a rectangular-pulse generator operating on the transmission-line principle (201, 202, 203), an attenuator 204 for attenuating multiple pulses, the pulse lines 205 and 207, the pulse measuring system (206, 211, 212, 213), the control computer 214, the pulse injector 215, the switch-over relay 208 and the leakage current measuring unit 209 and 210.

The loading and characterization of individual integrated elements (transistors, diodes, gate oxides) becomes possible due to the optional application of a second an possible third contact stud in the reference electrode (cf. FIG. 5).

The prerequisite for an optional contact establishment is a substrate mount suitable for manual or motorized drive and rotatable through 360°, which is adapted for being moved by motorized or manual drive with a lateral target position of at least ±20 $\mu$m. The vertical movement may be realized alternative, rotatability of the mount may be substrate support (substrate mount). In an alternative, rotatability of the mount may be omitted if the contact electrode is provided in the center of the reference electrode. In this case, too, an optional contact establishment is possible even without rotation.

The system can be optionally supplemented by a pulse-measuring system operating on the principle of time range reflectometric measurement (cf. FIGS. 4, 5). To this end, a pulse output coupler element 107 is integrated into the line carrying the loading pulse, at a spacing from the pulse input coupler means, which element presents a sufficient electric strength and couples initially a small part of the pulse power out into an oscilloscope. The wave reflected by the integrated circuit arrives on the oscilloscope with a delay by twice the pulse transit time on the line between the pulse output coupler means and the pulse input coupler means into the integrated circuit.

To prevent it from superimposing the in-flowing wave the pulse length must be shorter than twice the transit time on this part of the transmission line. A numerical separation and superimposition in the control computer 106 finally permits the determination of the voltage and current on the DUT. The measurement permits in any case a continuous monitoring of the system state and a simple calibration by contact opening or by the production of a short-circuit.

The pulse quality in terms of distortion is substantially determined by the quality, specifically the low attenuation, of the cables and the voltage standing Wave ratio of the junctions. The cables must also be chosen in consideration of the aspect of electric strength. In the event of transient pulses, however, the d.c.-voltage strength levels may be exceeded by a multiple.

The pulse-conducting components may be checked and characterised by means of a wide-band scanning oscillograph.

Figure 6A:
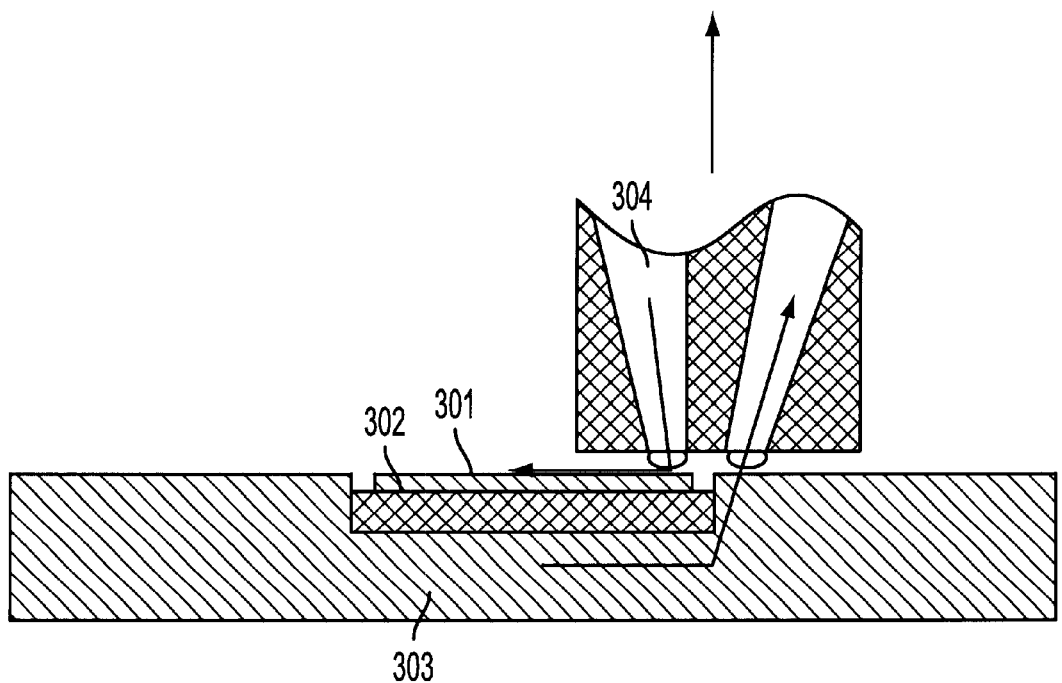
FIG. 6 illustrates the cross-sectional view (a) and the plan view (b) of an exemplary embodiment of another device suitable for performing the inventive method.
Figure 6B:
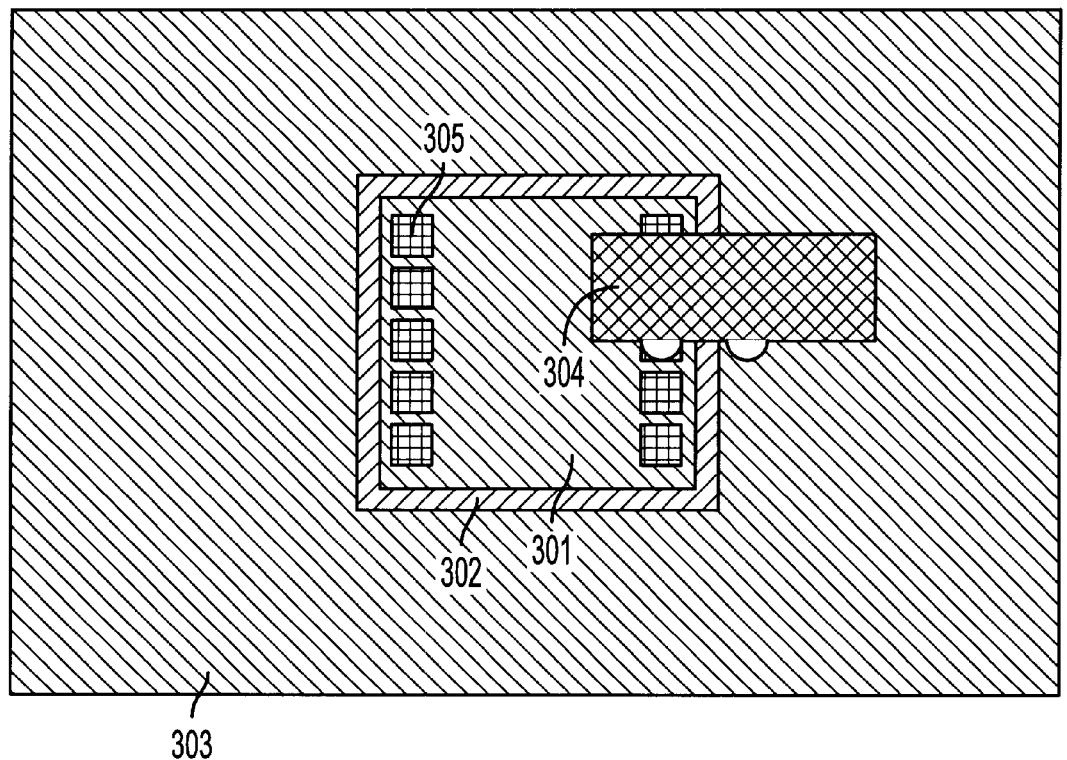

Moreover, the electric fail criteria must be determined before and after loading so as to increase the efficiency. To this end, a needle board connected to the function tester may be inserted in an alternative. For the characterization of individual elements and other structures with two terminals, an HF switch-over relay 208 maybe optionally included into the pulse path so as to be able to switch over between loading and leakage For the application of the method, it is also possible to use a device according to FIG. 6. This device consists of the reference electrode 303 having a depression in which a dielectric material 302 of constant thickness is provided. The integrated circuit 301 is then placed onto this material. Then the contact is established with one of the terminal areas 305 of this circuit via the contact electrode of an injector 304. The reference electrode contacts the injector electrically. In this embodiment, the spacing of the reference electrode relative to the substrate is thus set via the dielectric 302 as spacer.

The device and the method permit a comparable and reproducible high-current loading of integrated circuits even on a complete or subdivided semiconductor wafer.

With the ability to provide a defined intrinsic impedance of the complete system from pulse generation up to coupling-in, the loading pulse is stringently defined and thus dependent exclusively on the loaded integrated circuit.

The conditions applying to CDM discharges of the partial capacitors on the integrated circuit are largely maintained.

As the pulses are coupled in via the connecting pads of the integrated circuit, the problems caused by bent or excessively small terminals are avoided. An optical check of the contact prints on the pad permits an assessment of the contact quality after the loading operation. When examining the circuits at the wafer level, parasitic influences caused by the moulded plastic material of housings and capacitance-reducing gaps between the housing and the mount are avoided, which are difficult to control.

The device can be used in existing systems such as automatic testing systems without any problem.

The method and the device are also suitable for loading housed or packaged integrated circuits. In such a system the reference electrode is completely contacted with the dielectric material of the housing. The housing dielectric thus constitutes the dielectric (instead of air) provided between the reference electrode and the integrated circuit. The prerequisite in such a case is the provision that the housing dielectric isolates the reference electrode from the component terminals and the integrated circuit.

What is claimed is:

1. Device for pulsed high-current loading of integrated circuits, comprising:

a mount for receiving a substrate including one or several integrated circuits to be loaded;

and a pulse injector which comprises a reference electrode, a contact electrode for contacting terminal areas of said integrated circuits, and a support for said contact and reference electrodes, wherein said reference electrode has a plane surface adjustable in parallel with and to a defined spacing from the surface of a substrate inserted into said mount, with said contact electrode projecting through a recess or opening provided in said plane surface of said reference electrode, wherein said recess or opening is so wide that an optical adjustment of said contact electrode relative to the terminal areas of said integrated circuits through said reference electrode is possible, and that the partial capacitance existing between said reference electrode and said integrated circuit are not influenced, and wherein a mount is provided for a further contact electrode on said reference electrode, which further electrode when fastened is conductively connected to said reference electrode and projects through a further opening formed in the plane surface of said reference electrode.

2. Device according to claim 1, wherein said plane surface of said reference electrode has a size of 100 to 1000 mm².

3. Device according to claim 1, wherein said mount comprises an insulating plate.

4. Device according to claim 1, wherein said mount is a metal plate with a dielectric material resting thereon.

5. Device according to claim 1, wherein said mount is rotatable by means of a rotating means through 360° about an axis extending orthogonally on the surface of a substance inserted into said mount.

6. Device according to claim 1, wherein said reference electrode is adapted for being adjusted by means of a manipulator operated by a stepping motor, relative to the surface of said substrate.

7. Device according to claim 1, wherein said reference electrode is adapted for being adjusted by means of a substrate mount operated by a stepping motor, relative to the surface of said substrate.

8. Device according to claim 1, wherein said contact electrode is provided in the center of said plane surface of said reference electrode.

9. Device according to claim 1, wherein such contact electrode comprises a needle-shaped, semi-spherical, conical or frusto-conical configuration.

10. Device according to claim 1, wherein said reference electrode is connected to an exterior conductor and that said contact electrode is connected to an interior conductor of a coaxial pulse line or a standardised HF connector element.

11. Device according to claim 10, wherein said contact electrode is connected to said HF connector element via a transverse wave guide.

12. Device according to claim 11, wherein an HF switch-over element is provided which is adapted for switching over between a connected pulse generator means for loading and a device for measuring the steady state characteristic.

13. Device according to claim 1, wherein said reference and contact electrodes are connected to a pulse generator means.

14. Device according to claim 13, wherein a line of said pulse generator means, which carries the loading pulse, comprises a voltage-stable plus output coupler element at a spacing from a pulse input coupler element, which couples out a small fraction of the pulse power into an oscilloscope for time range reflectometric measurement.

15. Device according to claim 14, wherein said pulse generator means in equipped with a coaxial relay or a solid-state switch for pulse generation.

16. Method of pulsed high-current loading of integrated circuits, comprising:

adjusting a reference electrode with a plane surface in parallel with and at a defined spacing from a surface of a substrate with one or several integrated circuits to be loaded, such that said plane surface of said reference electrode covers the respective integrated circuit of said substrate, which is to be loaded, at least almost completely, adjusting a contact electrode relative to the terminal areas of said integrated circuit or structure to be loaded, contacting said contact electrode with said terminal area of said integrated circuit to be loaded, and applying a defined current pulse at said contact electrode for pulsed high-current loading;

wherein a reference electrode is inserted which has a plane surface projecting beyond the respective integrated circuit of said substrate, which is to be analyzed, laterally on at least three sides by a distance which exceeds the spacing of said reference electrode from said substrate surface, and wherein prior to the step of adjusting said reference electrode, said substrate is placed on a mount composed of a metal plate with a dielectric material placed thereon which has a thickness and a dielectric constant so dimensioned that the capacitance contributed by said mount to the capacitance of the system consisting of said reference electrode, said substrate and said mount will be negligibly small.

17. Method according to claim 16, wherein an optional dielectric is interposed between said reference electrode and the substrate surface.

18. Method according to claim 16, wherein the adjustment of said contact electrode is performed through a recess or opening in said reference electrode by means of microscope or an electronic video recognition system.

19. Method according to claim 16, wherein the pulse generation for applying a current pulse at said contact electrode is performed on the basis of the transmission line technique.

20. Method according to claim 16, wherein with the application of a wafer prober, several integrated circuits on the same substrate are contacted in succession and loaded with the same or different loading levels.

21. Method according to claim 16, wherein a needle board connected to a functional tester is inserted for contacting said integrated circuit.

22. Method according to claim 16, wherein the adjustment of said contact electrode is performed automatically on the basis of an existing CAD data basis as soon as the precise position of said integrated circuit has been identified.

* * * * *